United States Patent [19]

Vaillancourt

[11] Patent Number: 4,653,050
[45] Date of Patent: Mar. 24, 1987

[54] FAULT-TOLERANT MEMORY SYSTEM

[75] Inventor: Steven Vaillancourt, Redondo Beach, Calif.

[73] Assignee: TRW Inc., Redondo Beach, Calif.

[21] Appl. No.: 677,417

[22] Filed: Dec. 3, 1984

[51] Int. Cl.[4] .......................... G11C 8/00; G11C 29/00
[52] U.S. Cl. ..................................... 371/10; 364/900; 365/200; 371/11
[58] Field of Search ................ 371/11, 10, 38; 365/200; 364/200, 900

[56] References Cited

U.S. PATENT DOCUMENTS

| | | | |
|---|---|---|---|
| 3,644,902 | 2/1972 | Beausoleil | 371/11 |
| 3,765,001 | 10/1973 | Beausoleil | 365/200 |
| 3,812,336 | 5/1974 | Bossen et al. | 371/38 |
| 3,845,476 | 10/1974 | Boehm | 365/200 |
| 4,089,063 | 5/1978 | Takezono et al. | 365/200 |
| 4,483,001 | 11/1984 | Ryan | 371/11 |
| 4,489,403 | 12/1984 | Bond | 365/200 |
| 4,506,364 | 3/1985 | Aichelmann, Jr. et al. | 371/38 |
| 4,520,453 | 5/1985 | Chow | 364/900 |
| 4,562,576 | 12/1985 | Ratcliffe | 371/38 X |

*Primary Examiner*—Charles E. Atkinson
*Attorney, Agent, or Firm*—Noel F. Heal; Robert J. Stern

[57] ABSTRACT

A semiconductor memory structure having multiple memory modules that can be assigned or reassigned to serve in different logical memory locations, to obviate fault conditions detected in one or more modules. A logical addressing scheme treats the memory as having P pages, each with N multibit memory words. The memory modules are each 1×N bits in size and each module provides one bit of memory at the same bit position in every word in the page. This minimizes the effect of radiation damage, since a damaged module will affect only one bit in each word, and one missing bit in a word can be reconstructed using conventional error detection and correction techniques. The memory structure includes a memory mapping unit, which yields a set of module assignments for each page of memory.

7 Claims, 9 Drawing Figures

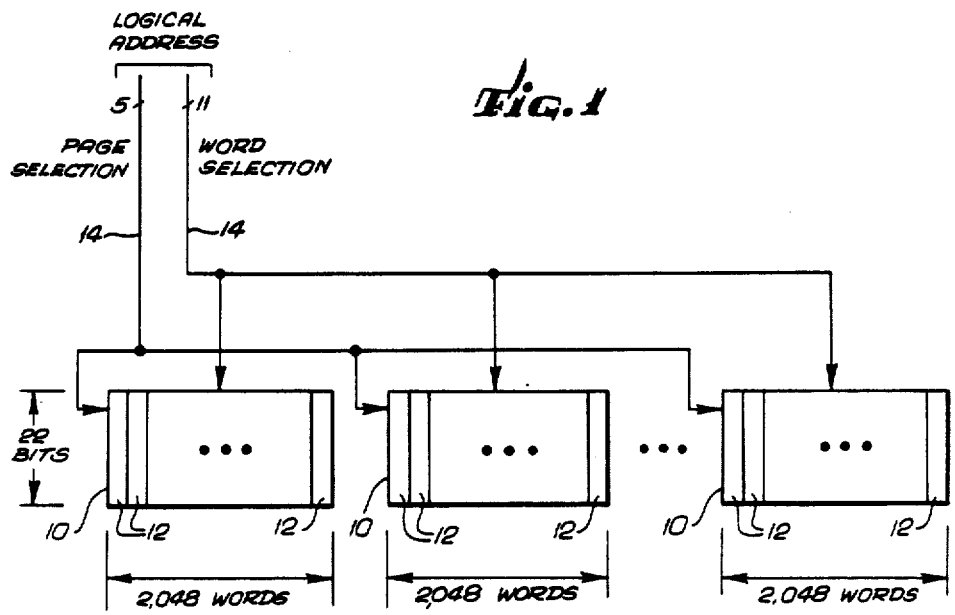
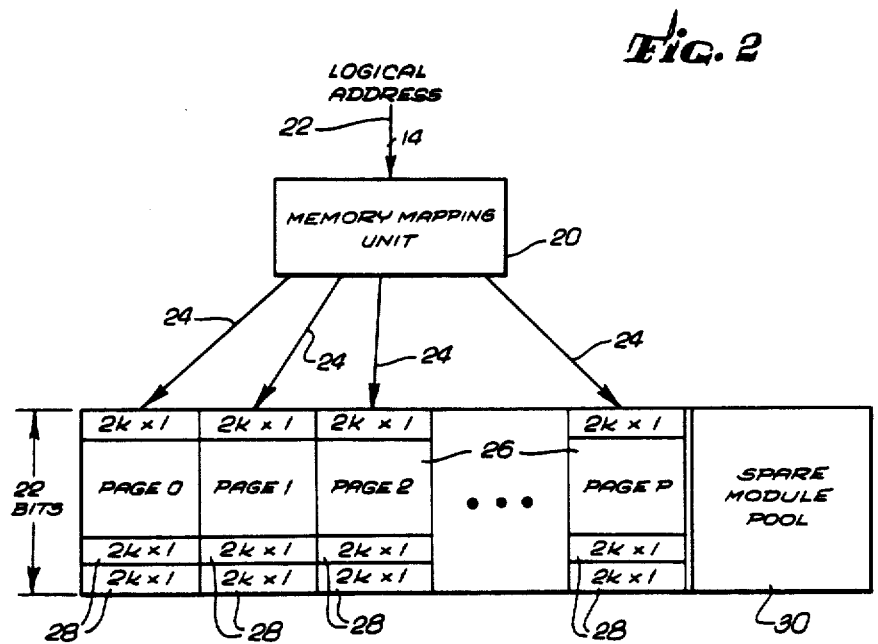

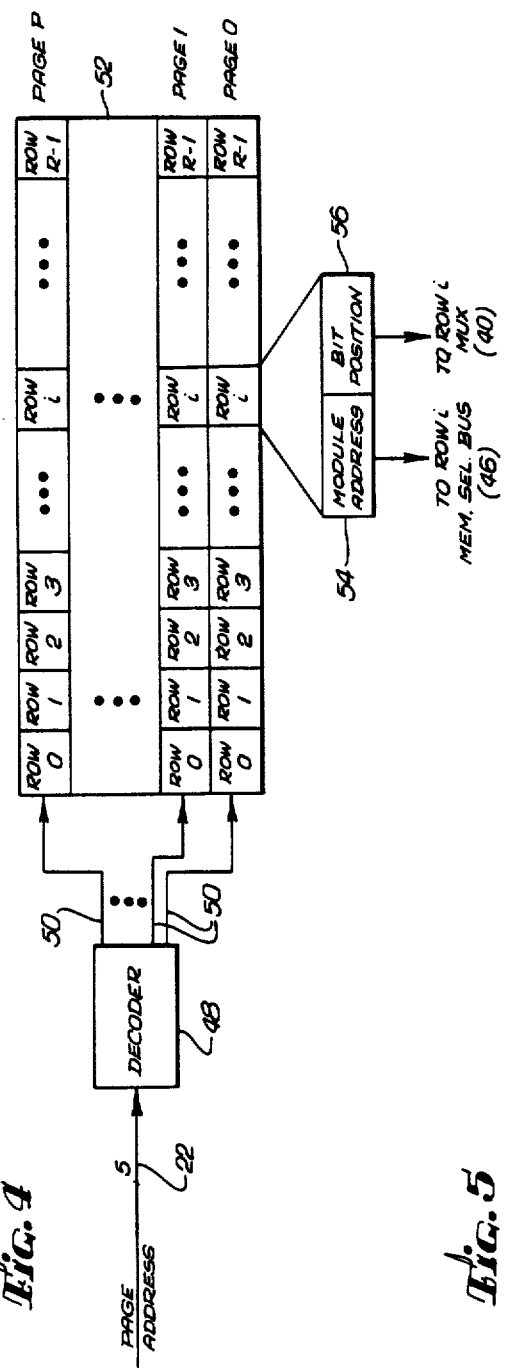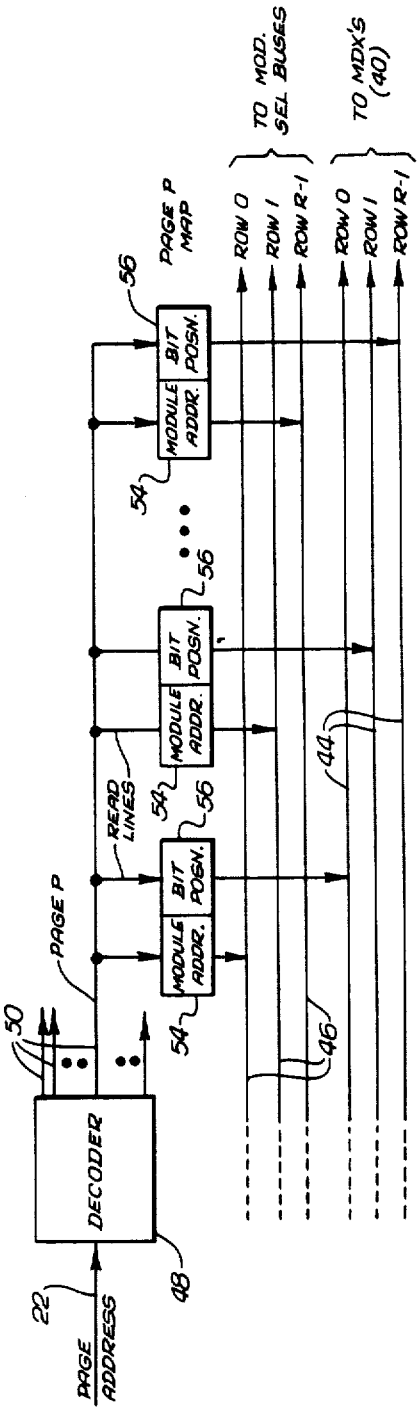
Fig. 4
Fig. 5

FAULT-TOLERANT MEMORY SYSTEM

BACKGROUND OF THE INVENTION

This invention relates generally to semiconductor memory structures, and more particularly, to very large memory arrays, which have a relatively high probability of containing defective memory cells. A semiconductor integrated-circuit memory takes the form of a two-dimensional array of memory cells fabricated together on a single semiconductor chip. Each memory cell typically stores one binary digit or bit of information, and the array is usually designed to store N "words" or information, each word being the same number of bits long. A common data word length is eight bits, which is referred to as a "byte." For convenience in handling binary cell addresses, the number of words in a memory array is usually a power of two, such as 1,024, 2,048, 4,096, and so forth. Each 1,024 words or bytes of memory is referred to as "1k" of memory. For example a "2 k" memory contains 2,048 words.

As the area of a semiconductor chip increases, so does the probability that there will be manufacturing defects within the chip. The manufacturing "yield" is the percentage of defect-free chips obtained in a production run. The probability of the occurrence of manufacturing defects in a unit surface chip area is approximately constant for a particular fabrication process. Therefore, larger chips will have more defects and a lower yield of defectfree circuits. Although the area of a specific circuit can be decreased by further reducing the scale of integration, i.e. by reducing the size of the circuit features and their spacing, this will ultimately result in an increase in the number of defects and a reduction in the yield.

An alternative to reducing the size of a circuit is to increase the effective production yield by rendering the resulting circuits more tolerant to defects, so that defective circuits can be repaired rather than discarded. Basically, this approach involves designing the circuit to include redundant or spare components, which can be logically connected into the circuit to replace components that have been found defective.

If there were an effective technique to render large circuits repairable in this manner, the maximum size of circuits could be greatly increased. In the past, integrated-circuit chips have been fabricated in multiple numbers on a much larger semiconductor wafer. At the end of the fabrication process, the wafer is "diced" into multiple circuit chips. If there were an effective technique for improving the effective yield of much larger chips, circuit size could be more easily increased to encompass an entire wafer. Prior to this invention, such wafer-scale integration has been limited by the approaches used to build redundancy into circuits such as large-scale memories.

Memory circuits are usually organized into arrays of rows and columns of one-bit cells. The usual approach for improving yield in large memory circuits is to include redundant storage cells that can be switched in on a row or column basis. There are a number of drawbacks to this approach. First, the spare rows or columns are good only for a low number of defects in particular configurations. Second, a related problem is that there is almost always a high proportion of unused good memory cells on the chip, even when the replacement capacity of the memory is exhausted. Another problem is that the replacement assignments are permanent. After testing and row or column replacement, if necessary, the circuit is packaged, and subsequently detected defects cannot be corrected.

Another source of circuit defects is radiation damage. This is highly significant for applications of circuitry to be used in a space environment where memory cells are there subject to damage by cosmic radiation. If only a single memory cell were to be damaged by cosmic radiation, the defect could be overcome by the use of an appropriate error detection and correction technique. A single-bit error in a relatively large data word can be detected and corrected without the need for reconfiguring the circuitry. However, there is a high probability that a cosmic radiation "strike" on a memory array would disable not just one cell, but several physically adjacent cells as well. If these damaged cells are all in the same data word, recovery by error detection and correction methods would not be possible. Accordingly, the ideal technique for reconfiguring a memory circuit should be one that minimizes the effects of radiation damage, and permits reconfiguration at any time after manufacture of the circuit. The present invention is directed to a memory system that provides a solution to the foregoing problems.

SUMMARY OF THE INVENTION

The present invention resides in a memory architecture that includes a number of redundant memory modules, which may be assigned or reassigned to serve as different portions of a logical memory organization. The logical memory organization includes a plurality of pages of memory, each of which includes a plurality of multi-bit data words. Each memory module is as long as the number of words in a page but is much narrower in width, and only one bit wide in the presently preferred embodiment.

Briefly, and in general terms, the architecture of the invention takes the form of a memory circuit addressable by a logical memory address that includes a memory page address and a memory word address within the specified page. The circuit comprises a plurality of memory modules, each having as many memory elements as there are memory words in a memory page, memory module mapping means, for associating any of the memory modules with a unique combination of memory page and bit position within each data word, and means for regulating data access to the memory modules such that a selected memory word in a selected memory page is distributed over a plurality of memory modules.

In the preferred embodiment of the invention, each memory module is an $N \times 1$-bit module, where N is the number of words in a page, and each memory page includes $N \times W$ bits, where W is the number of bits in each memory word. The memory modules are arrayed in R rows and C columns, where R is at least as great as the number of bits W in each memory word, and the total number of modules $R \times C$ exceeds the number of modules $W \times P$ needed to make up logical memory, where P is the number of pages. The memory module mapping means defines for each active module a page number and a bit position within the memory word. Each active module fulfills the storage requirements for a particular bit position in all of the memory words in the page. Thus the architecture is relatively immune to radiation damage, since damage to one memory module will affect only one bit in each of several logical memory words.

In the embodiment illustrated in this specification, each row of modules includes a common data bus, a common memory word address bus and a common module selection address bus. Each row of modules also includes data line multiplexing means, for selecting one data line from among W data lines used for storing and retrieving data. The memory module mapping means includes means responsive to a memory page address, for generating R data selection signals for application to the respective multiplexing means, and means for generating for each row a module address for application to the module address bus in each row. When a particular page of memory is addressed, the memory module mapping means selects one memory module in each row, and selects a bit position in the memory word. Each memory module includes means responsive to a memory word address, for selecting a memory-word position within the module. In this manner, each memory word is stored in or retrieved from memory, the bits of the memory word being stored in or retrieved from different memory modules located on different rows.

For some rows of modules, one or more pages may not be associated with any modules. In other words, there may be a large enough number of modules that some pages do not have to include a module from each row. In fact, this will usually be the case. Defective modules and spare modules will, of course, not be included as part of any memory page.

It will be appreciated from the foregoing that the present invention represents a significant advance in the field of semiconductor memory circuits. In particular, the invention provides a highly efficient technique for assigning and reassigning memory modules for use in a large logically addressed memory circuit. The circuit is resistant to cosmic radiation damage, and may be employed to reassign memory modules after testing for manufacturing defects, or at any subsequent time. Other aspects and advantages of the invention will become apparent from the following more detailed description, taken in conjunction with the accompanying drawings.

BRIEF DESCRIPTION OF THE DRAWINGS

FIG. 1 is a diagram illustrating the logical addressing scheme used in the memory system of the invention;

FIG. 2 is a diagram illustrating the basic concept of memory allocation used in the system of the invention;

FIG. 4 is a representation of the memory module mapping unit employed in the system of the invention;

FIG. 5 is a block diagram of the memory module mapping unit;

DESCRIPTION OF THE PREFERRED EMBODIMENT

Figure 3:
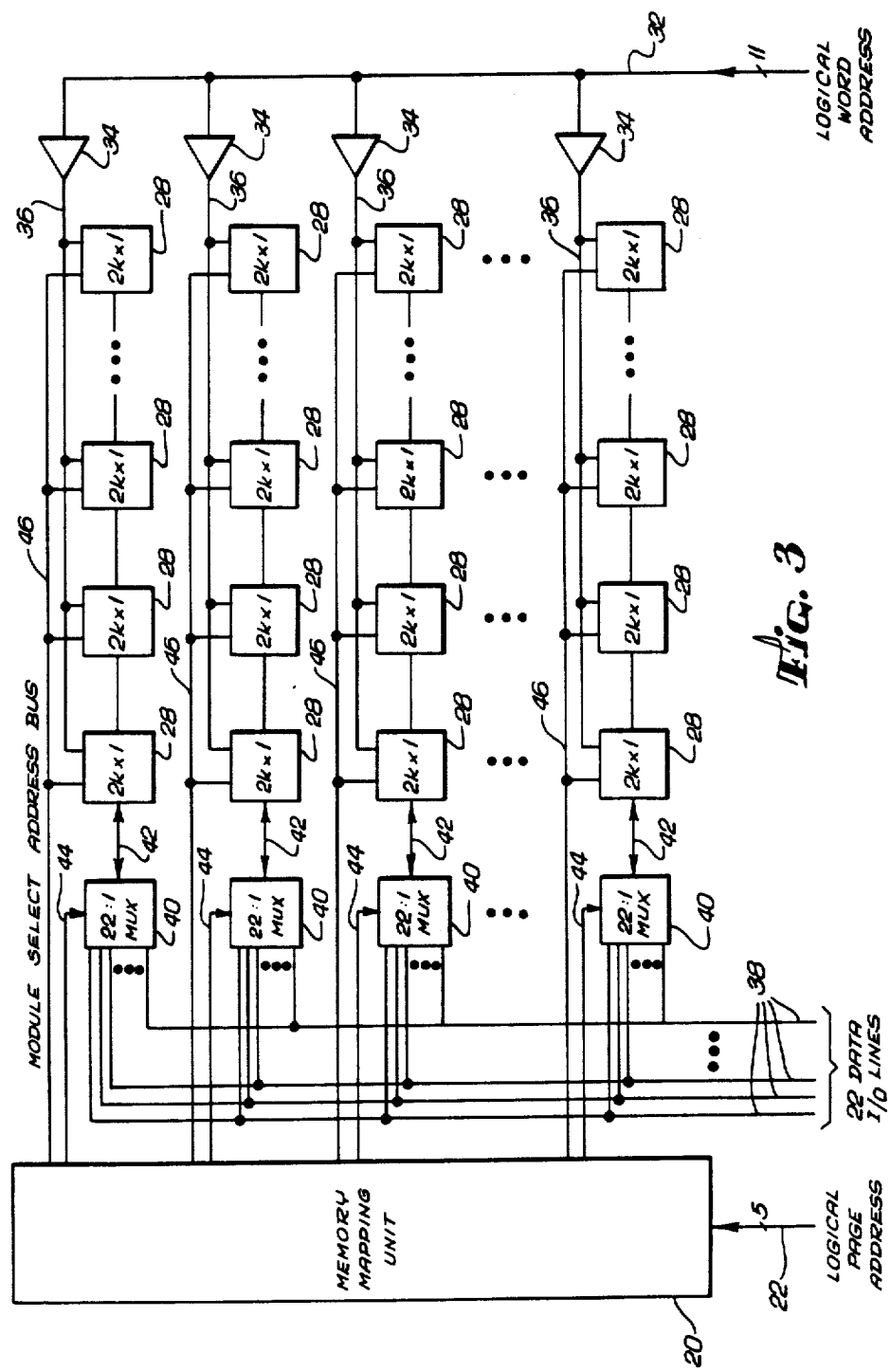
FIG. 3 is a block diagram of the memory system of the invention.

As shown in the drawings for purposes of illustration, the present invention is concerned with a memory system having a pool of spare memory modules for replacement of defective modules in a large memory circuit. The system of the invention avoids the problems inherent in replacing memory cells by row or column of a memory array.

In accordance with the invention, a large memory circuit is addressable by logical addresses that include a page address and a word address within a selected page, but the memory is physically segmented into modules that include the bits from multiple logical memory words. The addressing scheme employed will become clear as the description proceeds.

FIG. 1 shows the basic logical addressing scheme used in the system of the invention. The memory is divided into multiple pages, indicated by reference numeral 10, each of which includes a relatively large number of multiple-bit words, indicated at 12. In the illustrative embodiment, each page consists of 2,048 (2k) words of twenty-two bits each. Not all twenty-two bits are used for data storage, however. Sixteen bits contain data, and the remaining six are used for modified Hamming code check bits, which are used in a conventional manner to detect and correct data errors in the word. The memory is logically addressed by sixteen address lines 14, the five most significant of these carrying a page address, and the remaining eleven carrying a word address within a selected page. To a user of the memory system, it appears to be a multi-page memory, with each page having 2k addressable words of sixteen bits each.

As shown in FIG. 2, the basic principle of the invention involves the conversion of a logical address to a set of physical addresses. A key component of the system is a memory mapping unit 20, which receives a logical address on line 22 and generates mapped addresses on lines 24 to a plurality of memory pages, indicated at 26. Each memory page consists, in logical terms, of a plurality of multi-bit words. As illustrated, each page has 2,048 words of twenty-two bits each. In physical terms, however, each page comprises twenty-two memory modules, indicated at 28, each of which has 2,048 bits of memory. The modules 28 may be thought of as oriented orthogonally with respect to the logical memory words, such that one module provides the memory cells for the same bit position in each of 2,048 words. Contrary to the appearance of the modules in FIG. 2, they are not physically grouped by pages, but are assignable in any fashion to the logical addressing scheme. An excess of memory modules, indicated at 30, provides a pool of spare modules for assignment to any of the logical memory pages as the need arises, either because of manufacturing defects or because of a subsequent malfunction in a module.

More specifically, and as shown in FIG. 3, the memory system of the invention comprises the memory mapping unit 20, and a plurality of memory modules 28 arranged in an array of rows and columns. A five-bit logical page address is supplied to the memory mapping unit 20 over lines 22, and a further eleven bits of a logical word address are supplied to the address select inputs of modules 28 over lines 32, and thence to a set of buffer amplifiers 34. The outputs of the amplifiers 34 feed an address bus 36 on each row of memory modules.

Twenty-two data lines 38 are connected to a plurality of multiplexer/demultiplexers 40, referred to as MUX's, of which there is one for each row of memory modules. More particularly, each MUX 40 has twenty-two input lines connected to the respective data lines 38, and one output line 42. It should be understood, however, that the terms "input" and "output" as applied to the MUX's 40 are used only for reference purposes, since the MUX's 40 are bidirectional devices, carrying data in one direction when storing in the modules 28, and in the other direction for retrieving information from the modules. The "output" lines 42 are data buses coupled to the modules 28. Each MUX 40 is coupled to one data bus 42, which is connected to every memory module in the row with which the MUX is associated.

The MUX's 40 are each controlled by a set of address lines 44 supplied from the memory mapping unit 20. The memory mapping unit 20 also outputs control signals on lines 46, which are module address buses, of which there is one for each row of modules.

In a data reading or writing operation, a logical address is supplied to the memory system, including the page address on lines 22 and the word address on lines 32. The memory mapping unit 20 converts or "maps" the page address to a set of bit-position assignments on the MUX address lines 44 and a set of module assignments on the module selection address buses 46. There are at least as many rows of the memory modules 28 as there are bit positions in each memory word. In a word of twenty-two bit positions, for example, there will be at least twenty-two rows of memory modules, and the MUX's 40 will be controlled to assign each bit of data to its own row of modules. In the case of a writing operation, a selected data bit will therefore be asserted on the data bus 42 for an assigned row of modules. The module selection address on the module selection address bus 46 for that row, determines which of the modules in the row is to receive the data bit on bus 42. Since each module 26 has 2,048 bits of memory, it must also be determined into which particular memory cell the data bit is to be stored This is the role of the remaining eleven bits of the logical address on lines 32, which are applied to all of the modules 26.

It will be understood from this description and from inspection of FIG. 3, that a logical memory word is distributed across twenty-two different memory modules, which need not be in the same column of modules. Also, each logical page of memory employs no more than one module in any given row. A second use of a module on the same row would mean that the row had to handle two bit positions in the page, which is not possible because of the multiplexing arrangement used in each row.

The memory mapping unit 20 may take any of a number of specific forms. One of the simplest is that of a look-up table, shown in diagrammatic form in FIG. 4. The memory mapping unit 20 includes a decoder 48 for translating the page address on lines 22 into a 1-in-P signal on lines 50, where P is the number of pages, and a look-up table 52 having P rows, each with R entries, where R is the number of rows of memory modules 28. As previously indicated, R will be at least as great as the number of bit positions in each memory word. Therefore, for every page, the look-up table 52 provides an entry for each row of memory modules. For a particular row i, for example, the entry in the table 52 includes two fields of information, indicated at 54 and 56. The field 54 contains the module selection address, which is applied to the module selection address bus 46 for row i. This will select a particular memory module in row i for the selected page. The other field 56 in the table entry for row i contains a data bit position, which is applied to the MUX 40 for row i, thereby selecting a desired data line from the lines 38.

FIG. 5 shows in more detail how the memory mapping module is constructed to perform these functions. Each output line 50 from the decoder 48 initiates reading from an entire row of the look-up table, indicated at 60. The module selection fields 54 are connected to their respective module selection address buses 46, for all R rows of memory modules. Likewise, the bit-position fields 56 are connected to their respective MUX address selection buses 44, to effect selection of the desired data lines for connection to rows of the memory modules.

Not shown in FIG. 5 is the conventional logic necessary for writing information into the fields 54 and 56 of the memory mapping unit 20. Details of this will depend in part on the means employed for testing the memory system and reassigning memory modules. One approach is to assert module selection data and bit position data in a serial fashion on the appropriate buses 44 and 46, and to apply write control signals to all of the fields 54 and 56. Alternatively, a write control signal can be applied to a selected pair of fields 54 and 56, by means of a separate row number decoder (not shown), the data being input through a separate input data bus. In any event, the specific means for inputting data to the memory mapping module 20 is not claimed as part of this invention.

Figure 6:
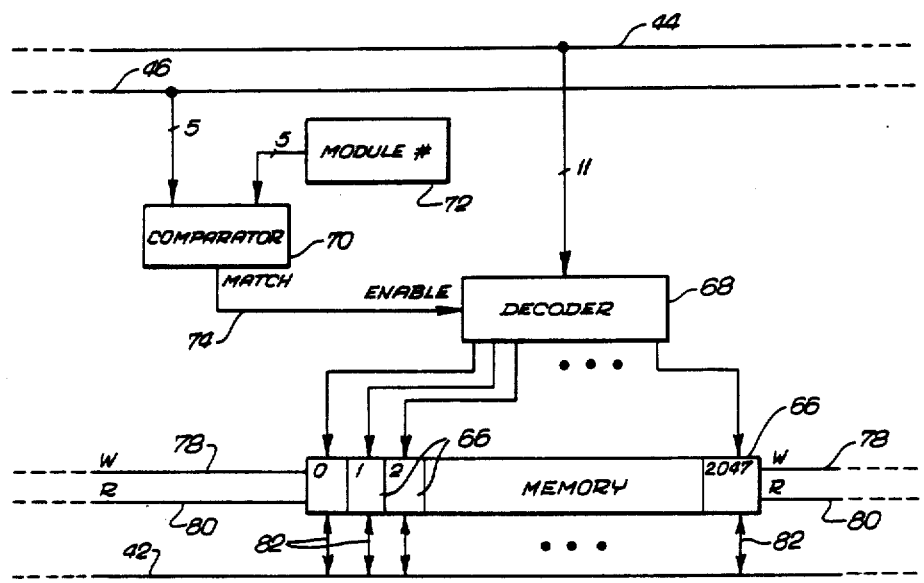
FIG. 6 is a block diagram showing the principal components of one of the memory modules.

Each of the memory modules 28 includes, as shown in FIG. 6, 2,048 one-bit memory cells, indicated at 66, a word address decoder 68, and a comparator 70. When a memory module number is impressed on the module address bus 46, this number in input to the comparator 70, which has as its other input the module number of this particular module. This module number may be hard-wired into the memory module, as indicated at 72. If there is a match, indicating that this module is selected, a match signal is generated on output line 74 from the comparator 70, and is employed to enable the decoder 68. The decoder 68 receives as its input eleven word address lines on bus 44, and generates as an output one of 2,048 signals on lines 76. these are connected as enabling signals to the respective memory cells 66 of the module. Read and write signals on lines 78 and 80 determine whether information is being stored in or retrieved from the memory, and input/output lines 82 connect each of the memory cells 66 with the one-bit data bus 42.

Figure 7:
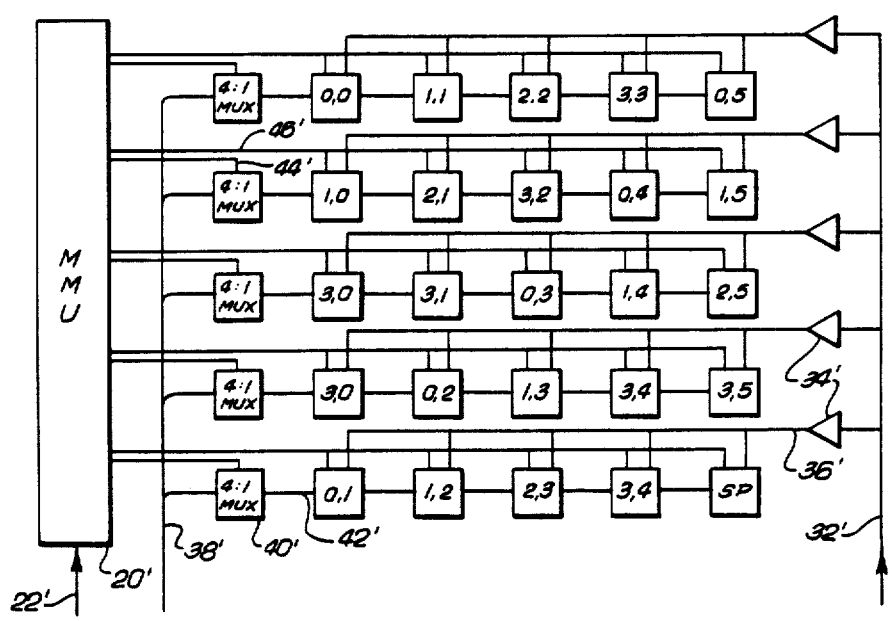
FIG. 7 is a block diagram of an exemplary 5×5 memory module used to store six pages of memory, each of which has 2k four-bit words.
Figure 8:
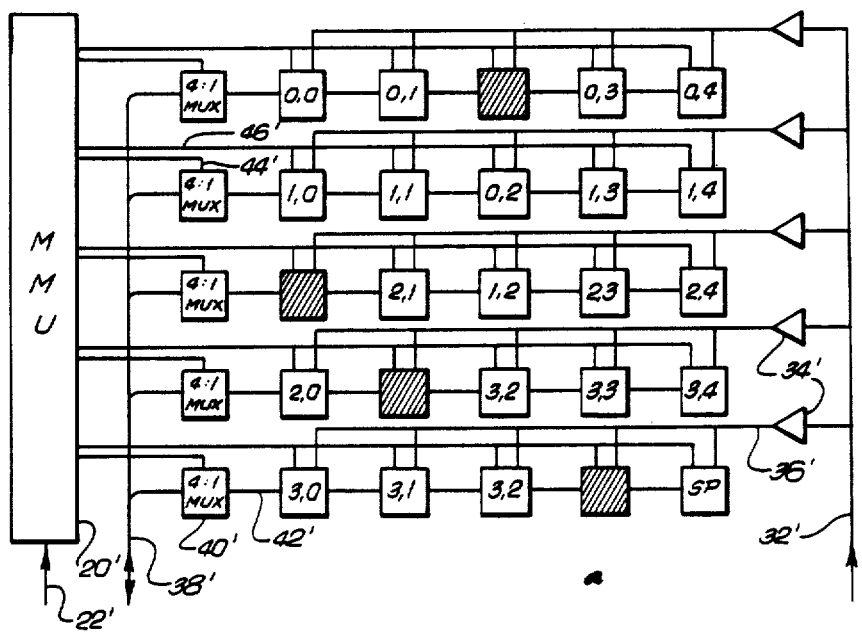
FIG. 8 is a block diagram of the memory module of FIG. 7 but used to store five pages of memory.
Figure 9:
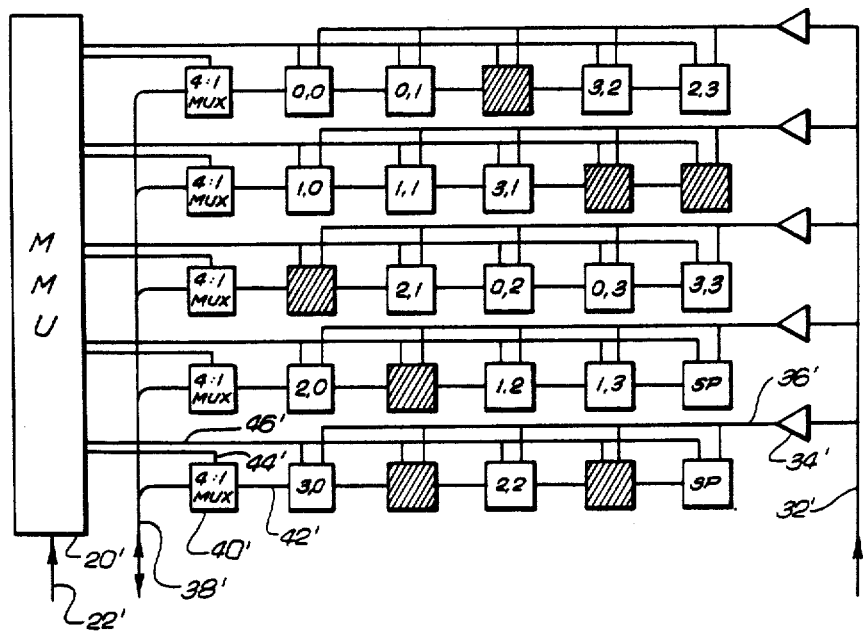
FIG. 9 is a block diagram of the memory module of FIGS. 7 and 8, but here used to store four pages of memory.

To illustrate how the memory system of the invention is applied to allocate memory modules in a specific situation, FIGS. 7-9 show a matrix of 5×5 memory modules used in a memory structure having 2,048-word pages, each word having four bits of data. FIG. 7 shows the memory mapping of the modules to accommodate six pages of memory, numbered 0 through 5. The pair of numerals (b,p) in each module 26 indicate the assignments of bit position and page number, respectively. Thus, page #0 employs the modules labeled 0,0 1,0 2,0 and 3,0 located in the first four rows of modules. The six pages of memory occupy 24 memory modules, leaving only one spare module.

FIG. 8 is a similar mapping arrangement, but for only five pages of memory. Twenty modules are needed, and four are shown as defective (the shaded ones) and one as spare. FIG. 9 shows the same memory configuration employed to store four pages of memory. In this example, there are seven defective modules and two spare ones. It will be observed that the limiting case for this configuration is one in which there are nine defective modules. A limit may be reached sooner, however, if all of the defective modules are concentrated in two rows, and not all of the bit positions can be assigned to a row. One solution to this problem is to employ one or more additional data buses on each row. Then a row would not be limited to handling only one bit position per page. The memory mapping module would then need to be modified to accommodate more than one module address and bit position for each row of modules.

It will be appreciated from the foregoing that the present invention represents a significant advance in the field of large-scale semiconductor memories. In particular, the invention provides a novel technique for assigning physical memory modules in a distributed manner throughout a set of logical addresses. The resulting memory system is resistant to radiation damage, and may be easily modified to reassign memory modules to avoid the use of defective modules. It will also be appreciated that, although a specific embodiment has been described in detail for purposes of illustration, various modifications may be made without departing from the spirit and scope of the invention. Accordingly, the invention is not to be limited except as by the appended claims.

I claim:

1. A memory circuit, addressable by a logical memory address that includes a memory page address and a memory word address within the specified page, the circuit comprising:
    a plurality of memory modules, each having as many memory elements as there are memory words in a memory page;
    memory module mapping means, for associating each combination of memory page and bit position within each data word on that page with a unique selected memory module; and
    means connected to the memory modules and to the memory module mapping means, for controlling data access to the memory modules such that a selected memory word in a selected memory page is distributed over a plurality of memory modules;
    wherein the memory modules are arranged in rows;
    wherein the memory module mapping means receives as input a logical page address, and supplies as outputs, to the means for controlling access to the memory modules, a set of module addresses and data word bit positions;
    wherein the means for controlling access to the memory modules includes multiplexing means for each row of modules, for selecting a data line for connection to the row of modules, and further includes module selection means for each row of modules;
    and wherein the memory mapping means includes means responsive to a page address for generating for each row of modules a module address for application to the module selection means, and a bit position address for application to the multiplexing means, whereby each memory page is mapped into a plurality of memory modules, each module serving as one bit position for all N words of the page.

2. A memory circuit having excess capacity to be used in the event of the detection of defects, the circuit being addressable by a logical address that includes a page address and a word address within the selected page, the memory circuit comprising:
    a plurality of memory modules, each having N bits of memory, where N is the number of words in a page, the modules being arranged in R rows, where R is at least as great as the number of bit positions in each word, and the total number of modules exceeds the product of the number of pages P and the number of bit positions W in each word;
    a data bus for each row, coupled to all of the modules in the row;
    multiplexing means for each row of modules, for connection of a selected data line, corresponding to a selected bit position, to the data bus for the row;
    a module selection address bus for each row;
    a word address bus coupled to all of the modules to effect selection of a particular word within a page;
    memory mapping means, responsive to a page address, for generating R data bit position signals for application to the respective multiplexing means, and R module selection addresses for application to the module selection address bus, whereby the addressing of a specific page results in the selection of a predetermined set of memory modules, one for each data bit position in each memory words.

3. A memory circuit as set forth in claim 2, wherein the memory mapping means includes:
    a page address decoder, for generating a page selection signal on one of P selection lines;
    a look-up table having P rows, each with R entries, each entry having a module selection field and a data bit selection field, and each row being enabled for access by a separate one of the P selection lines;
    means for gating the contents of each module selection field onto the module selection address bus for the row of modules with which it is associated; and
    means for transmitting the contents of each data bit selection field to the appropriate multiplexing means in each row of modules.

4. A memory circuit as set forth in claim 2, wherein each memory module includes:
    module selection means, responsive to signals on the module selection bus, to select the module for data transfer; and
    cell addressing means, responsive to signals on the word address bus, to select a cell within the module for data transfer.

5. A memory circuit as set forth in claim 4, wherein:
    the module selection means includes a comparator and a storage register to hold a module address; and
    the cell addressing means includes a decoder for decoding signals from the word address bus.

6. A memory circuit as set forth in claim 3, wherein each memory module includes:
    module selection means, responsive to signals on the module selection bus, to select the module for data transfer; and
    cell addressing means, responsive to signals on the word address bus, to select a cell within the module for data transfer.

7. A memory circuit as set forth in claim 6, wherein:
    the module selection means includes a comparator and a storage register to hold a module address; and
    the cell addressing means includes a decoder for decoding signals from the word address bus.

* * * * *